United States Patent [19]

Burns

[11] 4,242,635
[45] Dec. 30, 1980

[54] APPARATUS AND METHOD FOR INTEGRATED CIRCUIT TEST ANALYSIS

[75] Inventor: Daniel J. Burns, Rome, N.Y.

[73] Assignee: The United States of America as represented by the Secretary of the Air Force, Washington, D.C.

[21] Appl. No.: 6,839

[22] Filed: Jan. 26, 1979

[51] Int. Cl.³ .................................. G01R 31/22
[52] U.S. Cl. .......................... 324/158 R; 324/73 R; 324/96; 350/331 R; 350/347 E
[58] Field of Search ............ 324/158 F, 158 R, 73 R, 324/158 D, 96; 350/331, 347, 331 R, 347 E

[56] References Cited

U.S. PATENT DOCUMENTS

| | | | |
|---|---|---|---|
| 3,889,053 | 6/1975 | Lloyd et al. | 324/158 R |
| 3,934,199 | 1/1976 | Channin | 324/158 D |

*Primary Examiner*—Ernest F. Karlsen
*Attorney, Agent, or Firm*—Donald J. Singer; William Stephanishen

[57] ABSTRACT

An integrated circuit test analysis apparatus for visually interpreting voltage changes of active circuit components uses the electro-optic display effect of circuit electric field upon the liquid crystal layer which is applied over the circuit being tested. The normal state duty cycles in a repeating sequence of test states of the integrated circuit is modified by causing the integrated circuit to pause or maintain a particular state at one or more specific time periods for a predetermined time interval to permit the display to be recorded.

2 Claims, 8 Drawing Figures

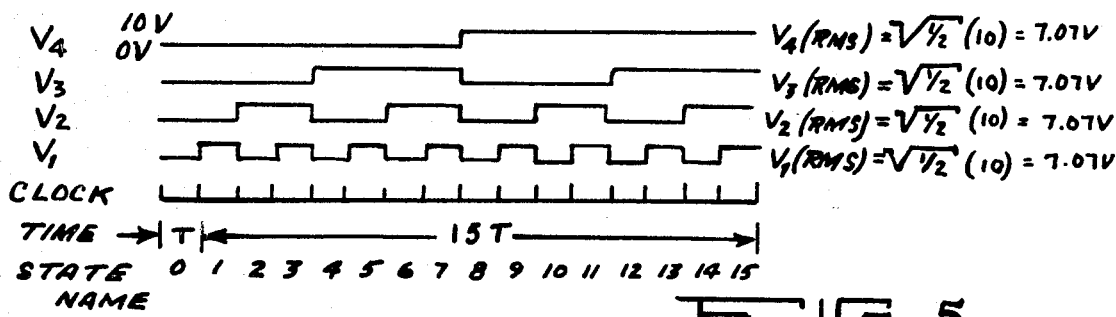
FIG. 4
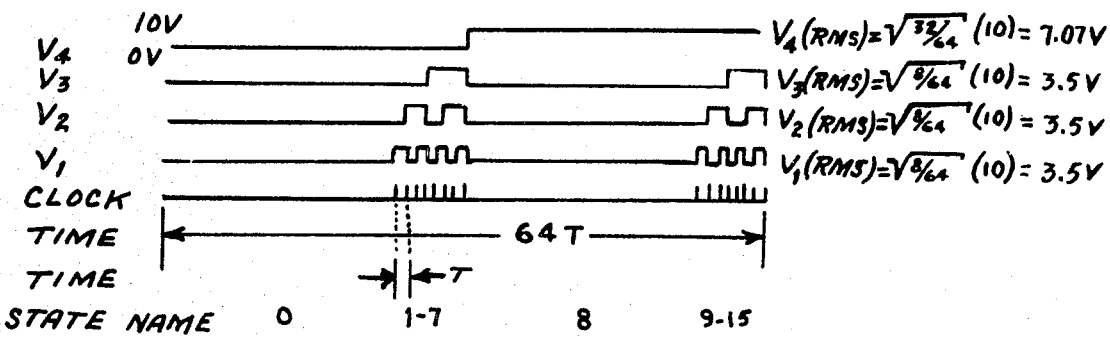
FIG. 5
FIG. 6

APPARATUS AND METHOD FOR INTEGRATED CIRCUIT TEST ANALYSIS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to an integrated circuit test apparatus, and in particular to the apparatus and method for testing circuit operation in an integrated circuit by modifying the normal state duty cycles in a repeating test cycle consisting of a sequence of many states to produce and observe a display which reflects circuit electrical characteristics during selectable states in the test cycle.

In the prior art, which is typified by U.S. Pat. No. 3,934,199, issued Jan. 20, 1976, a non-destructive method of testing electrical circuits on an integrated circuit utilizes a layer of liquid crystals over the circuit to provide visible indications in order that a comparison may be made between observed birefringent changes produced by the normally operating circuit. However, the prior art technique cannot be used to determine circuit node or conductor logic levels at any given instant in time during the testing sequence of a circuit. The set of logic levels present on various conductors in the circuit at a given instant in time which may be referred to as the circuit's state, binary state or digital state, most often constitute a set of binary digits which are stored or processed by the circuit. The ability to determine a circuit's state at many distinct instants in time is essential in failure analysis and design evaluation.

The present prior art test apparatus which utilized the liquid crystal technique requires that a comparison to the similar normally operating circuit be used in order to test for a faulty circuit. In other words, the prior art method operates upon observing the liquid crystal display of a good circuit and a bad circuit under the same normal excitation. What is actually observed is some pattern of light conductors on a dark background. While the observed patterns may be different for a good circuit and a bad circuit, the patterns, alone, provide no useful information about the many states the two circuits may assume at successive instants of time during their normal operation.

In fact at high clock rates (greater than 1,000 pulses/sec), a normally operating circuit may typically assume hundreds of states sequentially in time. The rate of progression from state to state is controlled by the input clock pulse rate and various other control inputs to the circuit. During this progression from state to state, there is a sequence of logic level changes on various conductors in the circuit which reflect the passing digital states. The overall response displayed in the liquid crystal (birefringent changes) is the result of an integration of these many changes over a long ($\leq 100$ ms) time period. The liquid crystal molecules respond by rotating from their initial orientation under the influence of the local electric field according to a root-mean-square (RMS) fashion. The electric field strength in the liquid crystal depends on the logic levels which are present on conductors during many hundreds of states over a relatively large time period ($\leq 100$ ms) of the normal circuit operation. Time resolution of these detailed changes in the circuit is lost in the integrating or averaging of the liquid crystal display mechanism when the circuit is operated at normal speed. If the clock pulse rate is slowed to visual rates (less than 10 pulses/sec) an effect can be observed which may be described as short flashes that may be seen in the liquid crystal display above conductors as logic levels change from 1 to 0 or 0 to 1. These flashes which last about one hundred thousands of a second, are very difficult to observe, and are not easily photographed. A determination of the logic state of the circuit 100 ms after a clock pulse has occurred by observation of the circuit display is truely impossible, since the display is no longer present. The eye simply cannot inspect the literally thousands of conductors which flash momentarily and die out in a very complex circuit. It is possible, however, to detect the presence or absence of such a flash over one or a very few particular conductors. By utilizing a good circuit, it may be possible to distinguish working and nonworking areas of the circuit. However, it is doubtful that the state of a very complex circuit with thousands of conductors could be determined by observing the flashing display, especially if the state of interest is assumed only after the application of hundreds of clock pulses. There are many types of complex circuits which simply do not operate with clock pulse frequencies of less than approximately 1,000 pulses per second. The present apparatus provides a direct static display which can be easily photographed and inspected at length to show the detailed differences between a single selected state and a reference state in a complex test state sequence. The present apparatus is used to produce static displays for many selected states with a single reference state. These static displays are recorded and compared to determine the differences between each selected state. When the set of conductor logic levels is known for the reference state, each static display shows directly the set of conductors which assume different logic levels in the selected and reference states, thus making possible a determination of the set of conductor logic levels of the selected state.

SUMMARY OF THE INVENTION

The present invention utilizes a liquid crystal in a sandwich structure display cell which is formed by the integrated circuit surface, a thin layer of liquid crystal and a glass coverplate. The liquid crystal can be a negative dielectric anisotropy type and the surfaces of the cell can be treated with lecithin and or a deposited gold layer to promote the required homeotropic (vertically aligned) molecular arrangement. Other types of liquid crystal might be used such as positive dielectric anisotropy types and those requiring twisted molecular arrangement. These other types may require different surface preparations. The coverplate may incorporate an electric field plate which allows independent external control of the electric field in the liquid crystal cell. When the RMS voltage across a conductor/field plate cell is greater than about 4.6 V, a highly visible display is produced directly above the conductor. Application of specially chosen voltage waveforms to this field plate allows new modes of operation.

A selective display is obtained which allows the user to determine the set of conductor logic levels of a selected state. The circuit is forced to cycle through a sequence of n distinct states (1, 2, 3, ... n) in a set time period T repeatedly. During each successive cycle through the n distinct states, the circuit is caused to pause in one or more states for a specific time period different than T/n by the application and sensing of input, control, clock and output terminal waveforms. The number and duration of these pauses are determined by an analysis of the circuit function, if known, or by consideration of the total number of distinct states in the test cycle. The resulting modification of the duty cycle of the voltage waveforms on the various conductors on the circuit insures that only certain conductors' waveforms have an RMS value sufficient to cause the electro-optic effect to occur above them. The overall display on the circuit can then be recorded for later reference. At some later time, a different set of conductors can then be made to cause a bright display above them by changing the duration of the pauses and/or the states during which the pauses are made. The set of states in the sequence may also be changed. The resulting display can then be recorded and compared with previously recorded displays to yield information to be used for failure analysis, design evaluation etc.

It is one object of the present invention, therefore, to provide an improved integrated circuit test apparatus wherein RMS voltages on the conductors on the circuit surface are modified by indirectly controlling the state duty cycles.

It is another object of the invention to provide an improved integrated circuit test apparatus utilizing specifically timed pauses in the normal state to state circuit operation to present a selective visual display.

It is still another object of the invention to provide an improved integrated circuit test apparatus wherein an electrically conductive, optically transparent metal layer is applied to the surface of the coverplate in contact with the liquid crystal.

It is yet another object of the invention to provide an improved integrated circuit test apparatus wherein specially chosen voltage waveforms are applied to the field coverplate to permit selective display of the conductor lines.

These and other advantages, objects and features of the invention will become more apparent after considering the following description taken in conjunction with the illustrative embodiment in the accompanying drawings.

BRIEF DESCRIPTION OF THE DRAWINGS

FIG. 4 is a graphical representation of the use of the field effect coverplate to the circuit display; and, FIGS. 5 and 6, respectively, are graphical representations of the normal and modified state duty cycle for a four-bit binary counter.

DESCRIPTION OF THE PREFERRED EMBODIMENT

Figure 1:
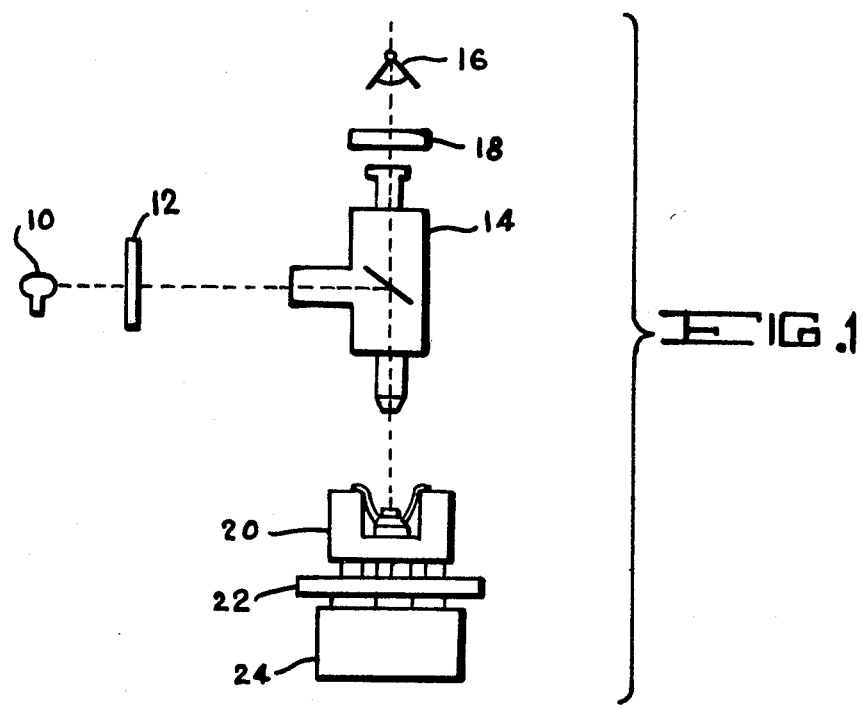
FIG. 1 is a schematic diagram of the integrated circuit test apparatus in accordance with the present invention.

Referring now to FIG. 1, there is shown an integrated circuit test apparatus for visually displaying the electrical states of a unit under test. The integrated circuit test apparatus comprises a light source 10, a polarizer 12 and a microscope 14 in conjunction with an observer or recording means 16 and a second polarizer 18, all of which apparatus is positioned above the integrated circuit 20. The circuit under test 20 is connected to the test electronic unit 24 by an interface means 22 which may be an interface socket card. The test electronic unit comprises all the necessary power supplies, pulse generators, pattern generators, comparators, counters, and other circuitry which may be utilized to provide the normal and modified state duty cycle to the unit under test 20. Light from the light source 10 is polarized by a linear polarizer 12 and used as a light source for microscope 14. The integrated circuit under test 20 may be viewed at point 16 by either an observer or recorded on a camera through another linear polarizer 18. The polarizers 12 and 18 are crossed and then rotated together until the darkest display is obtained when focused on the integrated circuit with no voltages applied. This procedure provides the proper conditions for the highest contrast display.

Figure 1A:
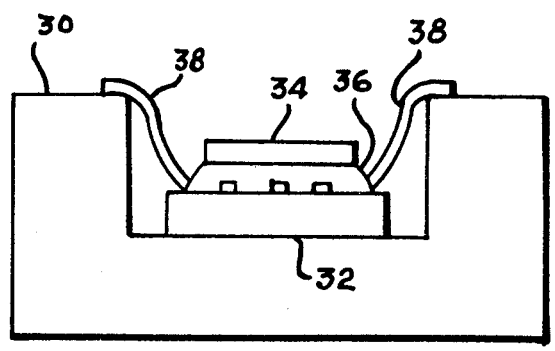
FIG. 1a is a detailed schematic diagram of the integrated circuit under test.

The integrated circuit under test 20 is shown in greater detail in FIG. 1a wherein the lid has been removed from the integrated circuit package 30 to expose the integrated circuit chip 32. The surface of the integrated circuit chip 32 is coated by either painting or spinning on a thin layer of lecithin which is dissolved in trichloroethylene in a ratio of about 5% by weight. One surface of a glass coverplate 34 is similarly treated. These treated surfaces are then allowed to dry overnight or are baked in an oven at 125° C. for 2 hours. Excellent results may be obtained by substituting a thin transparent gold coating for the lecithin surface treatment. A drop of liquid crystal 36 such as MBBA, which is commercially available, is placed on the surface of the chip circuit 32 and the coverplate 34 is put in place on this drop. Surface tension will hold the coverplate 34 and form a thin (about 10 $\mu$m) liquid crystal display cell. The excess liquid crystal 36 may be removed by wicking with the corner of a suitable absorption means.

The glass coverplate 34 must be cut to a size which will fit inside the perimeter defined by the bonds at the end of each fly wire 38 on the surface of the integrated circuit 32.

The present integrated circuit test apparatus provides two methods of visual observation of dynamic operating voltages in various portions of an integrated circuit (IC). The means comprises a nematic liquid crystal (LC) which provides a field effect display cell and is formed by the IC under test and a coverplate. The first method utilizes observation of localized changes in the orientation of the optic axis in a thin layer of nematic, birefringent liquid crystal which is placed in contact with an operating IC. These changes are induced by the electric fields associated with the metal conductor stripes near the surface of the IC structure. The electro-optic mechanisms which produce the visible displays, are well known and understood in the prior art. The present invention utilizes a state duty cycle modification to adjust the RMS electric fields appearing in the liquid crystal layer above the various conductor stripes on the IC under test. The LC layer is known to respond in a RMS fashion to electric fields, i.e., a bright display occurs only above conductor stripes which carry signal waveforms which have RMS voltages at or above a characteristic threshold voltage ($V_{TH}$) for a particular cell. This $V_{VTH}$ is about 3.5 V for the cells discussed herein, although 4.6 V will produce a much more easily interpreted visible effect.

A complex IC with sequential logic may typically be made to sequence through a given number of logic states repeatedly (e.g., a ring around connected shift register, a counter citcuit, a processor executing a loop of instructions, etc.). The state duty cycle modification method controls in a particular manner the time period spent in any or all of the states in the sequence. The progression from one state to the next in the loop is controlled in such a way that the duty cycle of one state is closer to 50% while the duty cycles of the rest of the states is substantially lower. The net effect is to reduce the duty cycle of all states but the one selected state at a specific instant of time. All conductors that change voltage as the circuit enters and leaves those unselected states will carry signals which have reduced RMS values. When adjusted properly, these values are made to be lower than that required to produce a visible display effect in the LC above these conductors. The one selected state will be visually apparent since the conductors changing voltage as this state is entered and left will carry signals with a higher RMS value. It should be noted that the maximum brightness corresponds to a duty cycle of 50%. This is due to charging effects on the outer surface of the glassivation layer of the IC and the RMS behavior of the LC. The effect is essentially independent of frequency between 500 Hz and 2 MHz.

There are several convenient methods which may be used to accomplish the state duty cycle modification. The clock input may be gated if permissible, special data may be loaded into the IC, an appropriate program might be executed by a processor, or the progressions from one state to the next might be otherwise controlled by applying and sensing the appropriate waveforms at the input, control and output terminals of various ICs. Special purpose clock gating circuitry may be utilized to accomplish this state duty cycle modification with ICs having various numbers of states. Thus, a selected state may be easily changed with this circuitry.

Figure 2A:
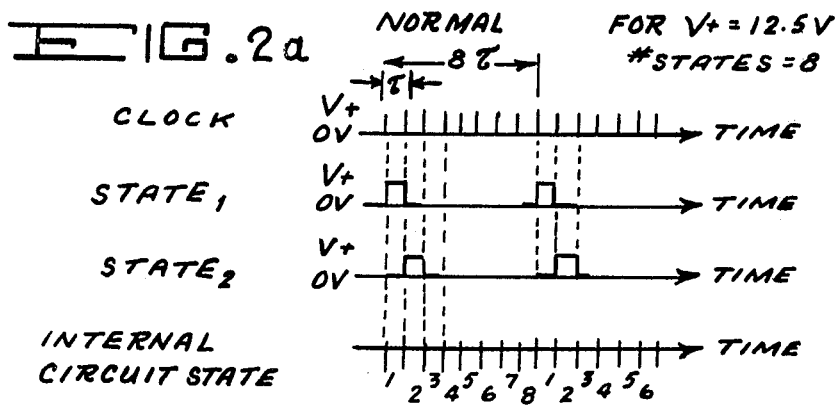
FIG. 2a is a graphical representation of the normal duty cycle operation of the circuit under test.
Figure 2B:
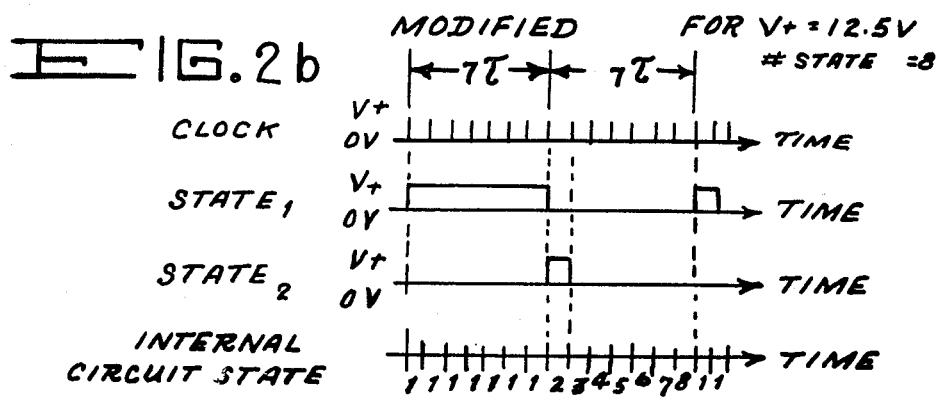
FIG. 2b is a graphical representation of the modified duty cycle operation of the circuit under test.

There is shown in FIGS. 2a and 2b the waveforms for a normal and a state duty cycle modification circuit at various internal circuit conductors associated with the selected and not selected states. In FIG. 2a, the states of a normal circuit are shown wherein all states are visible, the following equations apply:

$$V\text{state1}_{RMS} = \sqrt{\tfrac{1}{8}} \ (12.5v)$$
$$= 4.4v \text{ (visible)}$$
$$V\text{state2}_{RMS} = \sqrt{\tfrac{1}{8}} \ (12.5v)$$
$$= 4.4v \text{ (visible)}$$

In FIG. 2b, the states of a modified duty cycle circuit are shown wherein only the selective state is visible, the following equations apply:

$$V\text{state1}_{RMS} = \sqrt{\tfrac{1}{2}} \ (12.5v) = 8.8v \text{ (visible)}$$
$$V\text{state2}_{RMS} = \sqrt{\tfrac{1}{14}} \ (12.5v) = 3.3v \text{ (not visible)}$$

This method allows visual observation of portions of the circuit associated with the selected state only by brightly lighting those conductors which change from 1's to 0's or 0's to 1's as that state is lefted and entered. All other conductors on the chip will not light. Thus, circuit layout and functionality may be investigated and verified using the present method. The internal circuit nodes may be easily located and visually probed on complex ICs. The resulting display is significantly improved since conductor voltages associated with only one state contribute to the display rather than voltages associated with all states. The applications of the present apparatus and method include logic layout and implementation verification and functional checks of internal circuit nodes by simple visual means. Thus, the present invention is an alternative testing method to tedious and destructive mechanical die probing or scanning electron microscope voltage contrast techniques which are limited by beam induced charging that may degrade circuit performance.

Figure 3:
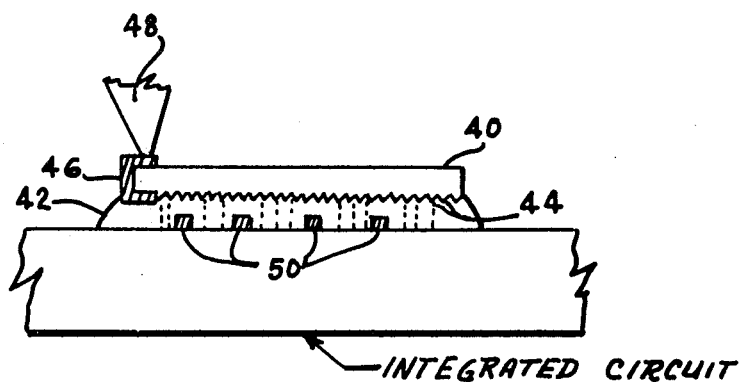
FIG. 3 is a detailed schematic of a field effect coverplate.

Turning now to FIG. 3, there is shown the second improvement to the above apparatus and methods. The lower surface of the glass coverplate 40 which is used to confine the liquid crystal layer 42 may be coated with an electrically conductive, optically transparent layer 44, such as gold. One edge or corner of the coverplate is dipped in conductive paint 46 or epoxy to allow an electrical contact to the conductive layer on the top side of the coverplate. This layer serves two purposes, (a) to promote the required homeotropic alignment in the LC which is perpendicular to the surfaces of the coverplate, and (b) to allow direct control of the RMS voltage appearing in the LC cells above the conductor stribes 50 on the IC surface by contacting the conductive layer on the coverplate from above with a standard micropositioner probe 48 and applying suitable voltage waveforms. Thus, the fundamental limitations of prior art methods in testing low voltage circuitry such as TTL, IIL, NMOS, etc. can be overcome. In the prior art, the maximum RMS voltage available on 5 V circuits is $(0.5)^{\frac{1}{2}}(5) = 3.5$ V, which is below the threshold for a usable display effect in MBBA (about 3.5 V–4.6 V). With the present field plate effect which is established by the conductively coated overplate, the electrical field above various IC metal runs can be directly controlled (either aided or opposed) to allow investigation of low voltage circuits. The prior art methods are limited to circuits which can operate on power supplies of 6.5 V or greater in order to obtain a 4.6 V RMS, 50% duty cycle square wave. The direct control of the voltage on the conductive coating of the coverplate available with the present method may be used in conjunction with, and or in place of the state duty cycle modification method described above to control the RMS field in the LC above various conductor stripes on the IC. The portion of the circuit to be visualized may be selected by applying various waveforms directly to the coverplate.

There is shown in FIG. 4 the waveforms which illustrate how to produce a display enhanced for selected conductor stripes on the IC. The application of a voltage waveform to the plate which is in or out of phase with a selected state will enhance the display above conductors carrying signals which are out of phase or in phase, respectively, with the selected state. The equation for the RMS value of the rectangular pulse train is given by:

$$V_{RMS} = \sqrt{\text{duty cycle}} \ (\text{peak voltage})$$

Applying the above equation to the condition shown in FIG. 4(e), the following results:

$$V_{RMS1} = \sqrt{\tfrac{1}{8}(13v)} = 4.6 \text{ v (VISIBLE)}$$

Applying the equation to FIG. 4(f) the following results:

$$V_{RMS2} = \sqrt{2/8}(6.5 \text{ v}) = 3.3v \text{ (DARK)}$$

It may be noticed that the plate voltage introduces a change in the peak voltage term in the equation for RMS voltage for the selected state (linear dependence) and a change in the duty cycle term (square root dependance) for all unselected states. This control allows selective displays of 1's or 0's, which is not possible with the previous techniques. The 1's and 0's or voltages may be directly determined at internal nodes depending on the phase of the signal applied to the coverplate (e.g. CLOCK and $\overline{\text{CLOCK}}$ lines can be distinguished).

A further advantage of the present test method is that the RMS voltage on the plate can be made large enough to turn the entire area under the plate bright, yet low enough that the fields on the IC can reduce the field in the LC cell over various selected conductors to below the threshold required for a bright display. In this manner, areas which are selected appear dark and areas not selected are bright. The same options for displaying 1's or 0's exists in the present mode of operation.

In order to more fully describe the general procedure for determining how to modify the normal operation of the circuit under test to obtain the desired results, two examples will be given. The following examples will allow observation of the new effects and will illustrate (1) the general approach for obtaining a selective display of certain portions of a circuit to aid in design and layout analysis and (2) an application to the problem of visually checking for proper operation of portions of a circuit which are deep inside the circuit and not directed accessible by external package pins for electrical testing.

The following specific example illustrates the evaluation of an individual flip-flop in a four-bit binary counter which is located on a complex circuit using the state duty cycle modification process. A 4-bit binary counter has four flip fop circuits which normally are clocked or cycled through 16 states, each of which represents a unique set of voltages (0 or 1) on conductors in the four flip flop circuits. The waveforms in FIG. 5 show the expected voltages associated with certain conductors in the four flip flops during the cycle. The respective RMS voltages are also shown in FIG. 5 for a 10 V power supply and normal clocking. It may be noted that all four RMS voltages are greater than the $V_{TH}$ minimum of 4.6 V required for a bright display. All conductors with these voltages would be displayed, making it impossible to distinguish the $V_4$ conductors from the others when using a test cycle with normal state duty cycle.

A display of the $V_4$ conductors alone may be obtained by applying the following clock pulse sequence. There is shown in FIG. 6 the change in clock pulse sequence which provides a modified state duty cycle that in turn affects the RMS voltage values of $V_1$, $V_2$ and $V_3$ thereby allowing the state of interest $V_4$ to be displayed. The power supply voltage is unchanged at 10 volts. The number of time slots (T) in the cycle was determined by first setting $V_{3RMS} = 3.5$ for a no display condition and calculating the required duty cycle for a 10 v peak waveform. The duty cycle is then set equal to 8/x where x is determined as the cycle length. This modification results in a minimum cycle length and the highest frequency of operation.

In the above example, the liquid crystal responds as if the circuit were changing to and from state 0 and state 8 only. The $V_4$ flip flop can easily be located since the only conductors which are displayed are the $V_4$ conductors. The $V_1$, $V_2$ and $V_3$ conductors may be similarly located by pausing in states 0 and 1, 0 and 2, and 0 and 4, respectively.

A second example is now described which results in a visual display of the contents of an internal storage register of a complex circuit such as a microprocessor. To accomplish this, a program is executed with first CLEARS (loads with 0's) the register of interest and then manipulates data and LOADS a result in the register. The program is executed repeatedly in a loop of 16 instructions. The timing of execution of the program instructions is modified as in example 1, with pauses inserted after the CLEAR and LOAD instructions. Again, the liquid crystal responds as if the CLEAR and LOAD instructions were the only two being executed and the conductors which are brightly displayed are only those associated with bits (flip flops) in the register which are being changed by the LOAD and CLEAR instructions in the cycling program. Thus, the information (data) being LOADED into a register by a certain instruction in the program can be directly read visually, and the proper operation of each flip flop in the register can be verified by observing the displays resulting from loading data which exercises each flip flop.

Although the invention has been described with reference to a particular embodiment, it will be understood to those skilled in the art that the invention is capable of a variety of alternative embodiments within the spirit and scope of the appended claims.

What is claimed is:

1. A method of testing an electrical circuit by observing birefringent changes in a layer of liquid crystals produced by electric fields in the liquid crystal which are induced by electric fields in the circuit during the operation of the circuit, said method comprising the steps of:

applying a layer of liquid crystals over said circuit with all of the liquid crystal molecules oriented in substantially the same direction, placing a transparent coverplate over said layer of liquid crystals by depositing an electrically conductive, optically transparent layer upon the lower surface of the coverplate, and forming an electrical contact from the lower surface to the upper surface of the coverplate, directing a beam of light through said layer with an optical system adapted to make said birefringent changes visible, energizing said circuit to produce said birefringent changes by sequencing the circuit through a number of logic states, pausing the logical sequencing at one or more selected states, adjusting the duty cycle of the selected state or states to substantially 50% while the duty cycle of all other states is substantially lower, recording the birefringent changes with said optical system, adjusting the RMS electric fields appearing in the liquid crystal layer above selected conductor stripes by applying control signals to the electrical circuit with predetermined timing pauses therein to hold a selected state, and observing said birefringent changes with said optical system, whereby the selected state birefringent changes may be observed or recorded.

2. A method as described in claim 1 further including the step of:

applying voltage waveforms to the conductive layer on the coverplate to increase or decrease the electric fields in the liquid crystal in synchronism with the progression of circuit states.

* * * * *